(12) United States Patent
Huo et al.

(10) Patent No.: US 8,048,705 B2
(45) Date of Patent: Nov. 1, 2011

(54) METHOD AND STRUCTURE FOR A CMOS IMAGE SENSOR USING A TRIPLE GATE PROCESS

(75) Inventors: Jieguang Huo, Shanghai (CN);
Jianping Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/258,732

(22) Filed: Oct. 27, 2008

(65) Prior Publication Data

US 2010/0015745 A1 Jan. 21, 2010

(30) Foreign Application Priority Data

Jul. 15, 2008 (CN) .......................... 2008 1 0040741

(51) Int. Cl.
*H01L 21/00* (2006.01)

(52) U.S. Cl. .................. 438/57; 438/200; 257/E31.057; 257/E31.058; 257/E31.06; 257/E31.063; 257/E31.066; 257/E31.073; 257/E31.075; 257/E31.076; 257/E31.079; 257/E31.08

(58) Field of Classification Search ........................ None
See application file for complete search history.

(56) References Cited

U.S. PATENT DOCUMENTS

| 5,903,021 | A | 5/1999 | Lee et al. |
| 6,258,673 | B1* | 7/2001 | Houlihan et al. ............. 438/275 |
| 6,498,331 | B1* | 12/2002 | Kozlowski et al. ......... 250/208.1 |
| 6,545,302 | B2 | 4/2003 | Han |
| 6,908,839 | B2 | 6/2005 | Rhodes |
| 2003/0062561 | A1* | 4/2003 | Guidash ........................ 257/300 |
| 2005/0001277 | A1* | 1/2005 | Rhodes ......................... 257/431 |
| 2007/0241372 | A1* | 10/2007 | Kao ............................... 257/233 |

FOREIGN PATENT DOCUMENTS

| CN | 1669149 A | 9/2005 |
| CN | 1897253 A | 1/2007 |

* cited by examiner

*Primary Examiner* — Charles Garber
*Assistant Examiner* — Yasser Abdelaziez
(74) *Attorney, Agent, or Firm* — Kilpatrick Townsend and Stockton LLP (57) ABSTRACT

A method of forming a CMOS image sensor device, the method includes providing a semiconductor substrate having a P-type impurity characteristic including a surface region. The method forma first thickness of silicon dioxide in a first region of the surface region, a second thickness of silicon dioxide in a second region of the surface region, and a third thickness of silicon dioxide in a third region of the surface region. The method includes forming a first gate layer overlying the second region and a second gate layer overlying the third region, while exposing a portion of the first thickness of silicon dioxide. An N-type impurity characteristic is formed within a region within a vicinity underlying the first thickness of silicon dioxide in the first region of the surface region to cause formation of a photo diode device characterized by the N-type impurity region and the P-type substrate.

20 Claims, 8 Drawing Sheets

METHOD AND STRUCTURE FOR A CMOS IMAGE SENSOR USING A TRIPLE GATE PROCESS

CROSS-REFERENCE TO RELATED APPLICATIONS

This application claims priority to Chinese Application No. 200810040741.7, filed Jul. 15, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and a structure for manufacturing a CMOS image sensor device having a reduced dark current characteristics for advanced application. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed.

An example of such a limit is in image sensors especially in consumer applications. As demand for pixel sensitivity and pixel density increases, pixel layout and related integrated circuit design become more critical. These and other limitations will be described in further detail throughout the present specification and more particularly below.

From the above, it is seen that an improved technique for processing semiconductor devices is desired.

BRIEF SUMMARY OF THE INVENTION

According to embodiments of the present invention, a method of forming a CMOS image sensor device is provided. More particularly, the invention provides a method and structure for manufacturing a CMOS image sensor device free of non-light transmitting contact region and having a reduced dark current. But it would be recognized that the invention has a much broader range of applicability. For example, the method can be applied to manufacturing other integrated circuits such as logic devices, memory devices, and others.

According to an embodiment of the present invention, a method and as structure of forming a CMOS image sensor device is provided The method includes providing a semiconductor substrate having a P-type impurity characteristic. The semiconductor substrate includes a surface region. The method forms a first thickness of silicon dioxide in a first region of the surface region. The method forms a second thickness of silicon dioxide in a second region of the surface region. The method forms a third thickness of silicon dioxide in a third region of the surface region. The method includes forming a first gate layer overlying the second region and a second gate layer overlying the third region while exposing a portion of the first thickness of silicon dioxide. The method includes forming an N-type impurity characteristic within a region within a vicinity underlying the first thickness of silicon dioxide in the first region of the surface region to cause formation of a photo diode device characterized by the N-type impurity region and the P-type substrate.

In an alternative embodiment, a method of forming a CMOS image sensor device is provided. The method includes providing a semiconductor substrate having a P-type impurity characteristic. The semiconductor substrate includes a surface region. The method includes forming a first thickness of silicon dioxide in a first region of the surface region, forming a second thickness of silicon dioxide in a second region of the surface region, and forming a first gate layer overlying the second region and a second gate layer overlying the third region, while exposing a portion of the first thickness of silicon dioxide. The method also forms an N-type impurity characteristic within a region within a vicinity underlying the first thickness of silicon dioxide in the first region of the surface region to cause formation of a photo diode device characterized by the N-type impurity region and the P-type substrate.

Many benefits are achieved by way of the present invention over conventional techniques. For example, the present technique provides an easy to use process that relies upon conventional technology. In some embodiments, the method provides higher device reliability and performance. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to embodiments of the present invention, techniques for forming a CMOS image sensor is provided. In particular, embodiments according to the present invention provide techniques to form CMOS image sensor having a reduced leakage current. But it would be recognized that embodiments according to the present invention have a much broader range of applicability. For example, embodiments according to the present invention may be applied to forming other integrated circuit devices and others.

CMOS image sensors are emerging as a preferred technology for digital consumer applications. To enable improved pixel sensing performance, CMOS image sensor technology requires improved pixel layout design and integrated circuit processing. Dark current is a major factor influencing sensor performance especially under a low light condition. Factors that may contribute to dark current include defects on the silicon surface and silicon-gate oxide interface in photodiode regions and surrounding regions.

Figure 1:
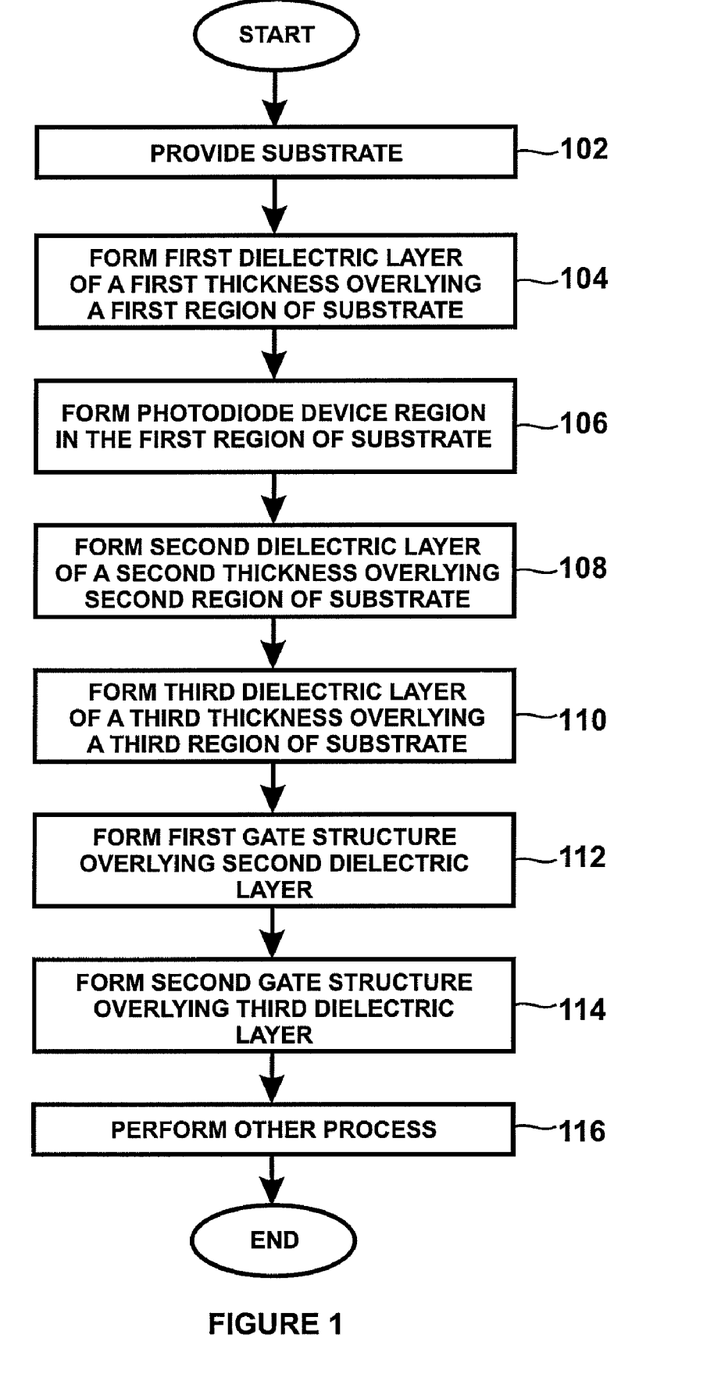
FIG. 1 is a simplified process flow for forming a CMOS image sensor according to an embodiment of the present invention.

FIG. 1 is a simplified process flow diagram illustrating a method of forming a CMOS image device according to an embodiment of the present invention. As shown, the method provides a semiconductor substrate having a P type impurity characteristics (Step 102). The semiconductor substrate can be a single crystal silicon wafer or a silicon on insulator, or a silicon germanium substrate or the like. The method includes forming a first dielectric layer overlying a first region of the semiconductor substrate (Step 104). The first dielectric layer is characterized by a first thickness. In a specific embodiment, the first dielectric layer can be silicon oxide formed using a thermal growth process. In a specific embodiment, the first region includes a photodiode device region formed within the semiconductor substrate (Step 106). The method also forms a second dielectric layer of a second thickness overlying a second region of the semiconductor substrate (Step 108). The method forms a third dielectric layer overlying a third region of the semiconductor substrate (Step 110). In a specific embodiment, the method forms a first gate structure overlying the second dielectric layer (Step 112) and a second gate structure overlying the third dielectric layer (Step 114). The method performs other steps to complete the CMOS image sensor device (Step 116). Of course there can be other variations, modifications, and alternatives.

The above sequence of steps provides a method of forming a CMOS image sensor according to an embodiment of the present invention. As shown, the method includes a step of providing a dielectric layer overlying photodiode device region. The dielectric layer protects the surface region and interfacial regions of the substrate from damage and contamination. Alternatively, one or more steps may be added, one or more steps may be deleted, one or more steps may be performed in a different order depending on the specific embodiment.

FIGS. 2-11 are simplified diagrams illustrating a method of forming a CMOS image sensor according to an embodiment of the present invention. In particular, FIGS. 2-11 illustrate a method for forming a triple gate structure for the CMOS image sensor. These diagrams are merely examples and should not unduly limit the scope of the claims herein. One skilled in the art would recognize other variations, modifications, and alternatives.

Figure 2:
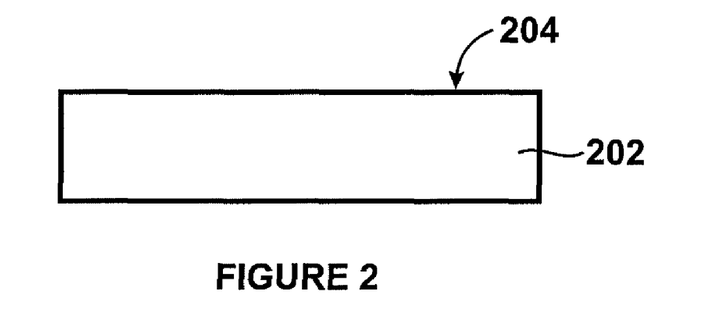
FIGS. 2-11 are simplified drawings illustrating a method of forming a CMOS image sensor according to an embodiment of the present invention.

As shown in FIG. 2, the method includes providing a semiconductor substrate 202. The semiconductor substrate includes a surface region 204. The semiconductor substrate can be a silicon wafer, a silicon on insulator (SOI) substrate, a silicon germanium substrate, and the like. In a specific embodiment, the semiconductor substrate is a silicon wafer doped with a P-type impurity. Of course there can be other variations, modifications, and alternatives.

Figure 3:
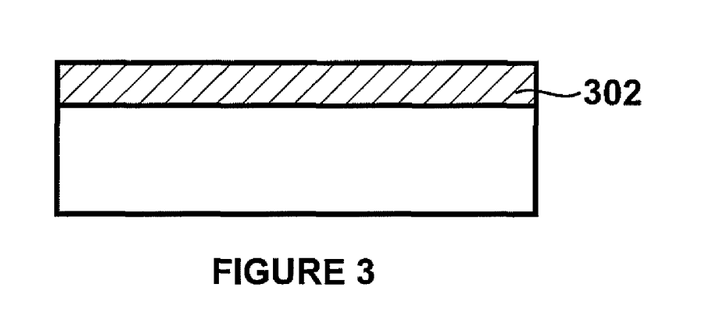

Referring to FIG. 3, the method includes forming a first dielectric layer 302 overlying the surface of the semiconductor substrate. The dielectric layer can be a grown thermal oxide, a deposited silicon oxide, silicon nitride, or a combination depending on the application. In a specific embodiment, the first dielectric layer is formed using thermal oxide having a thickness ranges from about 10 Angstroms to about 200 Angstroms. Of course there can be other variations, modifications, and alternatives.

Figure 4:
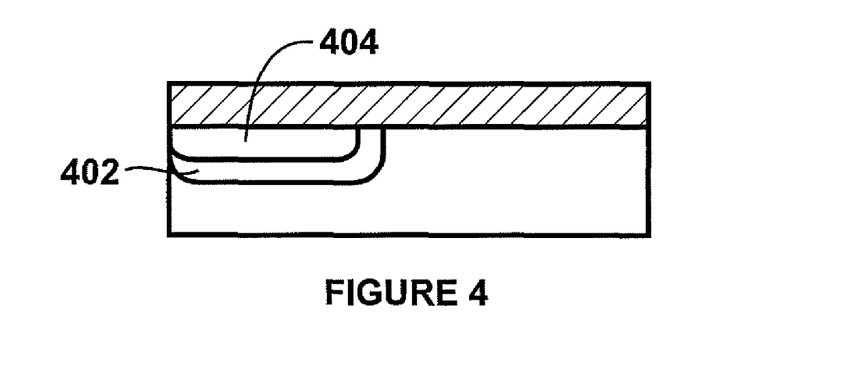

As shown in FIG. 4, the method forms a N type impurity region 402 in a first portion of the P-type semiconductor substrate. In a specific embodiment, the N type impurity region and the P type impurity cause a formation of a photodiode device region within the semiconductor substrate. The N type impurity may include species such as phosphorus, arsenic, or antimony or the like. For example, the N type impurity region may be provided using an ion implant process using an arsenic species. Implant energy ranges from about 280 KeV to about 500 KeV at a dose of 1E12 atoms per $cm^2$ to about 5E13 atoms per $cm^2$ depending on the application. Of course there can be other variations, modifications, and alternatives. Also shown in FIG. 4, a P-type impurity is formed in a surface region 404 of the photodiode device region to form a pinned photodiode device structure. The pinned photodiode structure reduces certain dark current, for example, dark current due to surface defects. Of course there can be other variations, modifications, and alternatives.

Figure 5:
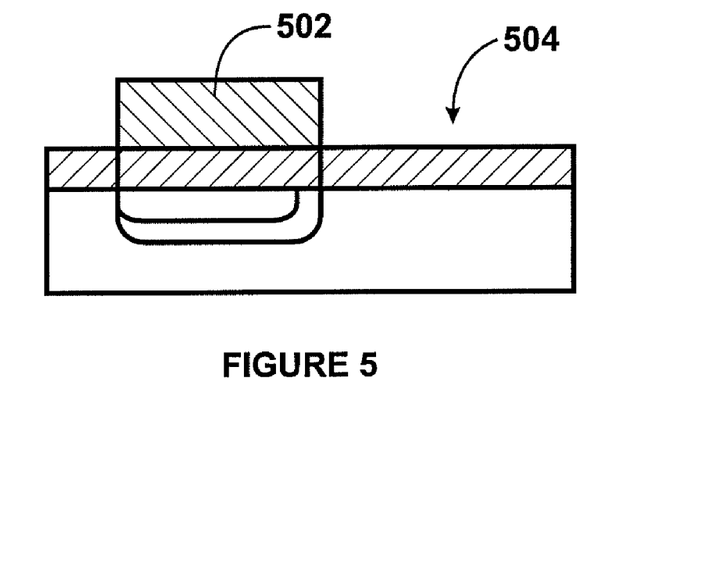
Figure 6:
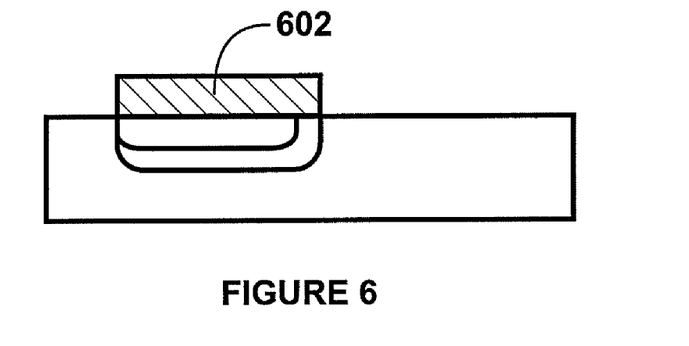

In a specific embodiment, the method forms a first masking layer 502 overlying a first region of the first dielectric layer and expose other region 504. As shown, the first region of the first dielectric layer overlies at least the photodiode device region. The first masking layer can be provided using a photoresist material in a specific embodiment. The method includes removing the exposed first dielectric layer as shown in FIG. 6. A thickness of the first dielectric 602 overlies the photodiode device region. In a specific embodiment, the portion of the exposed first dielectric layer can be removed using a dry etch process known in the art. Alternatively, the exposed first dielectric layer may be removed using a wet etch process, depending on the application. One skilled in the art would recognize other variations, modifications, and alternatives.

Figure 7:
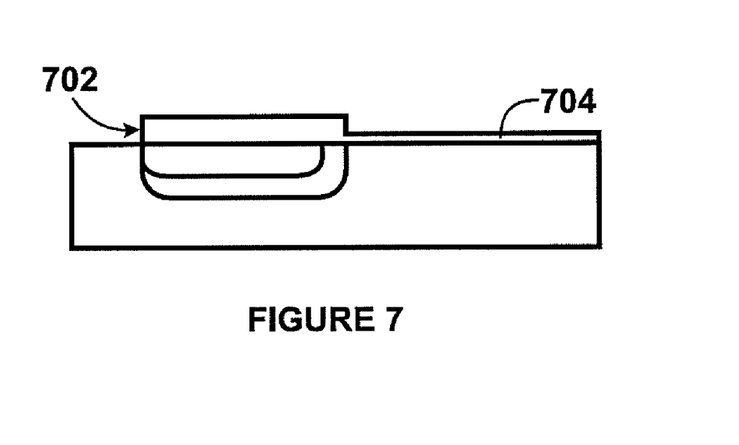

Referring to FIG. 7, the method includes subjecting the semiconductor substrate to a thermal oxidation process. As shown the thermal oxidation process forms a second dielectric layer overlying the semiconductor substrate. The second dielectric layer includes a second thickness 702 overlying the photodiode device region and a third thickness 704 overlying other surface region of the semiconductor substrate. As shown, the second thickness is greater than the third thickness.

Figure 8:
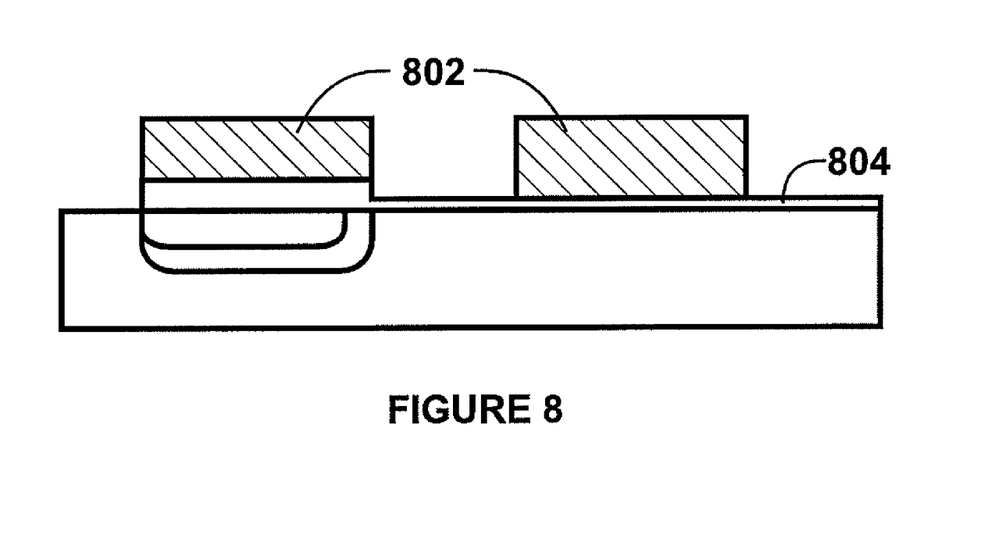
Figure 9:
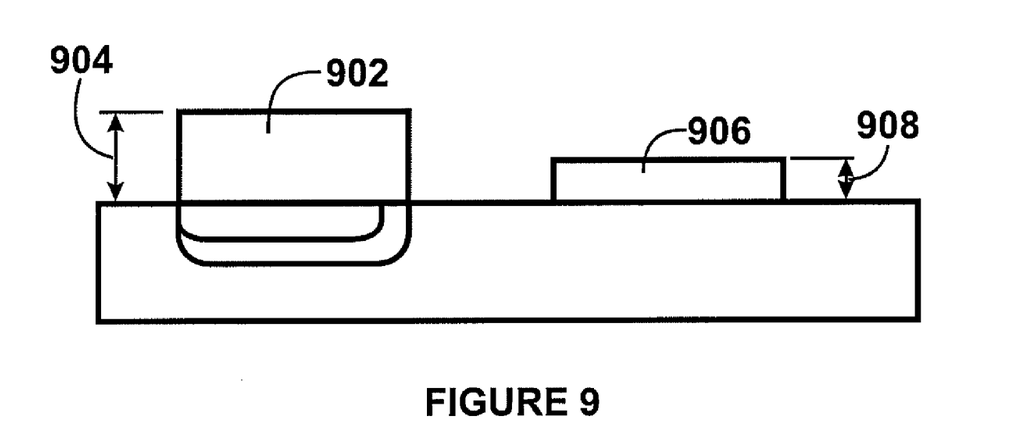

Referring to FIG. 8, the method includes forming a second masking layer 802 overlying a portion of the second dielectric layer and exposing other region. The portion of the second dielectric layer includes the portion overlying the photodiode device region and a first region 804 of the CMOS image sensor as shown. The method includes removing the exposed second dielectric layer as shown in FIG. 9 The exposed second dielectric layer can be removed using an etching process in a plasma environment known in the art or alternatively, the exposed second dielectric layer may be removed using a wet etch process depending on the embodiment. As shown, the resulting dielectric layer comprises a first portion 902 having a thickness 904 overlies the photodiode device region and a second portion 906 having a thickness 908 overlies the first region. Of course there can be other variations, modifications, and alternatives.

Figure 10:
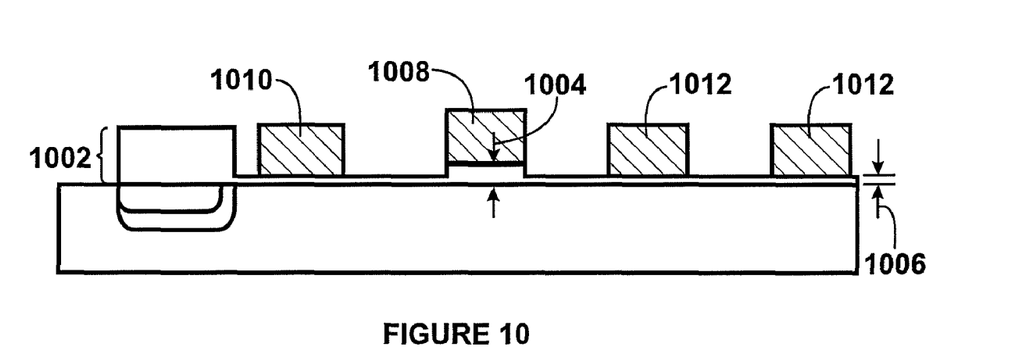

As shown in FIG. 10, the method includes subjecting the substrate to a second thermal oxidation process resulting in the formation of a third dielectric layer overlying the semiconductor substrate. In a specific embodiment, the third dielectric layer has a fourth thickness 1002 overlying the photodiode device region, a fifth thickness 1004 overlying the first region, and a sixth thickness 1006 overlying a second region of the semiconductor substrate. As shown, thickness 1002 of dielectric layer overlying the photodiode region is greater than thickness 1004 and thickness 1004 is greater than thickness 1006. In a preferred embodiment, fourth thickness 1002 of the third dielectric layer overlying the photodiode device can be greater than about 70 Angstroms. In an alternate embodiment, thickness 1002 can be greater than about 100 Angstroms. Thickness 1002 provides protection to the underlying photodiode device region in subsequent plasma etching process steps (e.g., side wall etch) in a specific embodiment. Of course there can be other variations, modifications, and alternatives.

In a specific embodiment, the method includes forming a first gate structure 1008 overlying the first region of the third dielectric layer and a second gate structure 1010 overlying the second region of the third dielectric layer. Additionally, gate structures 1012 are provided in a peripheral region. The first gate layer and the second gate layer can be formed by deposition, patterning, and etching of a doped polysilicon material in a specific embodiment. In a specific embodiment, gate structure 1010 can be configured to couple to the photodiode device. For example, gate structure 1010 can be a source follower gate coupled to a diffusion region of the photodiode device. In a specific embodiment, the source follower gate can have a threshold voltage of 1.8 volts but can be others. In a specific embodiment, gate structure 1008 can be a reset gate having a threshold voltage of 3.3 volts but can be others. Of course there can be other variations, modifications, and alternatives.

Figure 11:
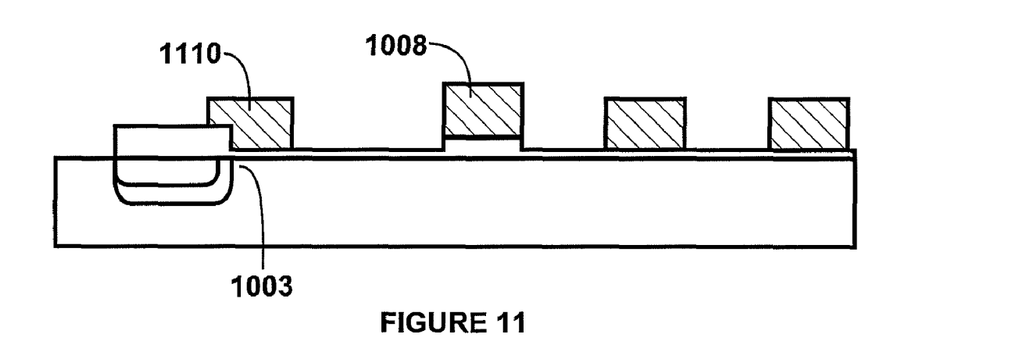

In a specific embodiment, the fourth thickness of the dielectric layer overlying the photodiode device region may be provided to extend to overly an area 1103 surrounding the photodiode device region as shown in FIG. 11. Such a configuration provides additional protection to the interfacial region of the photodiode device region and the substrate. Of course there can be other variations, modifications, and alternatives.

Figure 12:
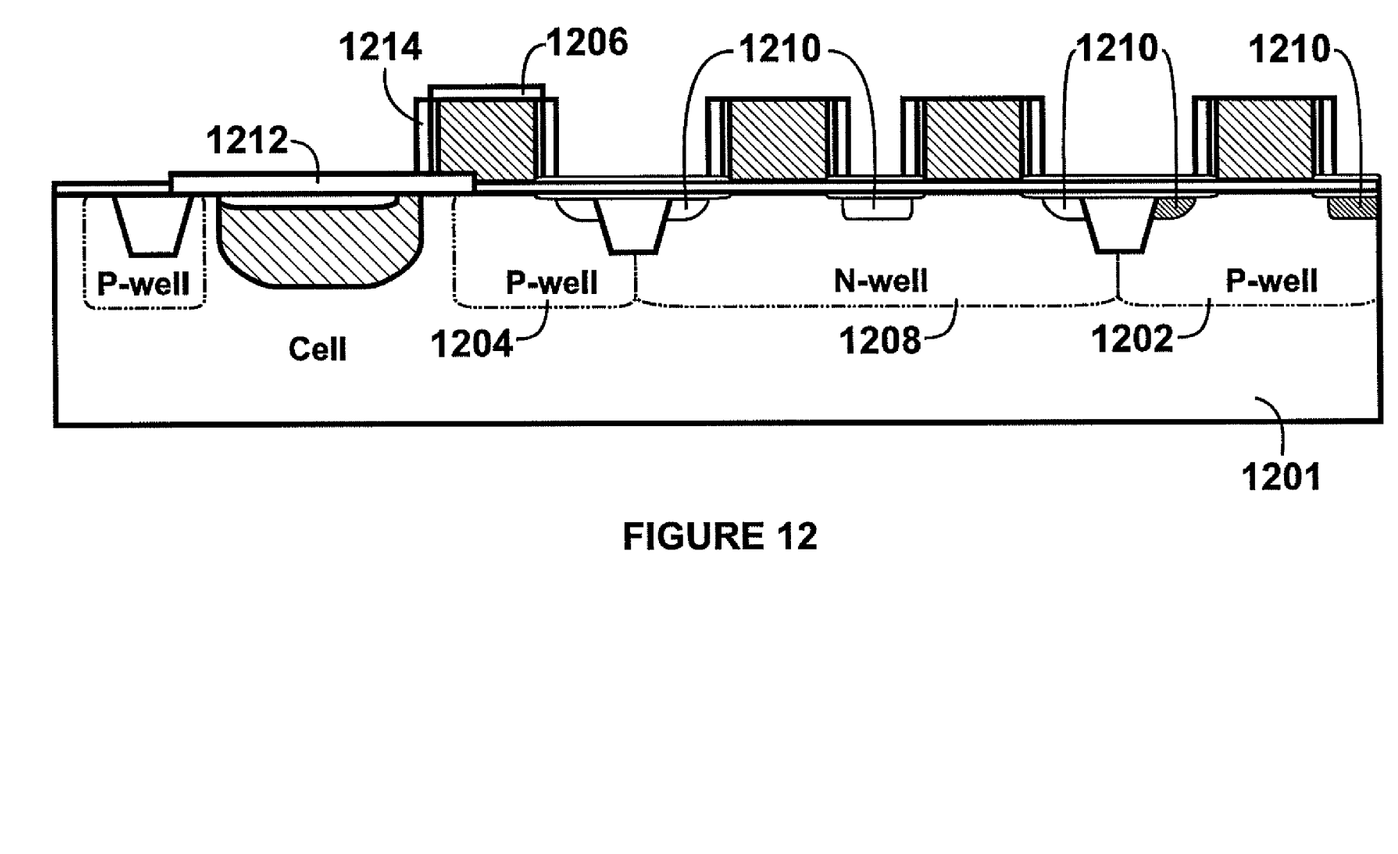
FIG. 12 is a simplified diagram illustrating an experimental result according to an embodiment of the present invention

The method also includes forming doped well regions and source/drain regions within the semiconductor substrate. For example, as shown in FIG. 12, the CMOS image sensor includes P well regions 1202 and N well regions 1208 for periphery circuitry and P well region 1204 for, e.g., transfer gate 1206 for the CMOS image sensor. Source/drain regions 1210 are also shown. Each of the source/drain regions can also include lightly doped regions in a specific embodiment.

The method includes forming side wall spacer structures 1214 overlying a portion of respective gate structures. The side wall spacer structures can be formed by depositing a blanket dielectric layer followed by an anisotropic etch process. The anisotropic etch process is usually a dry etch in a plasma environment using a suitable reactive species. Of course there can be other variations, modifications, and alternatives.

Figure 13:
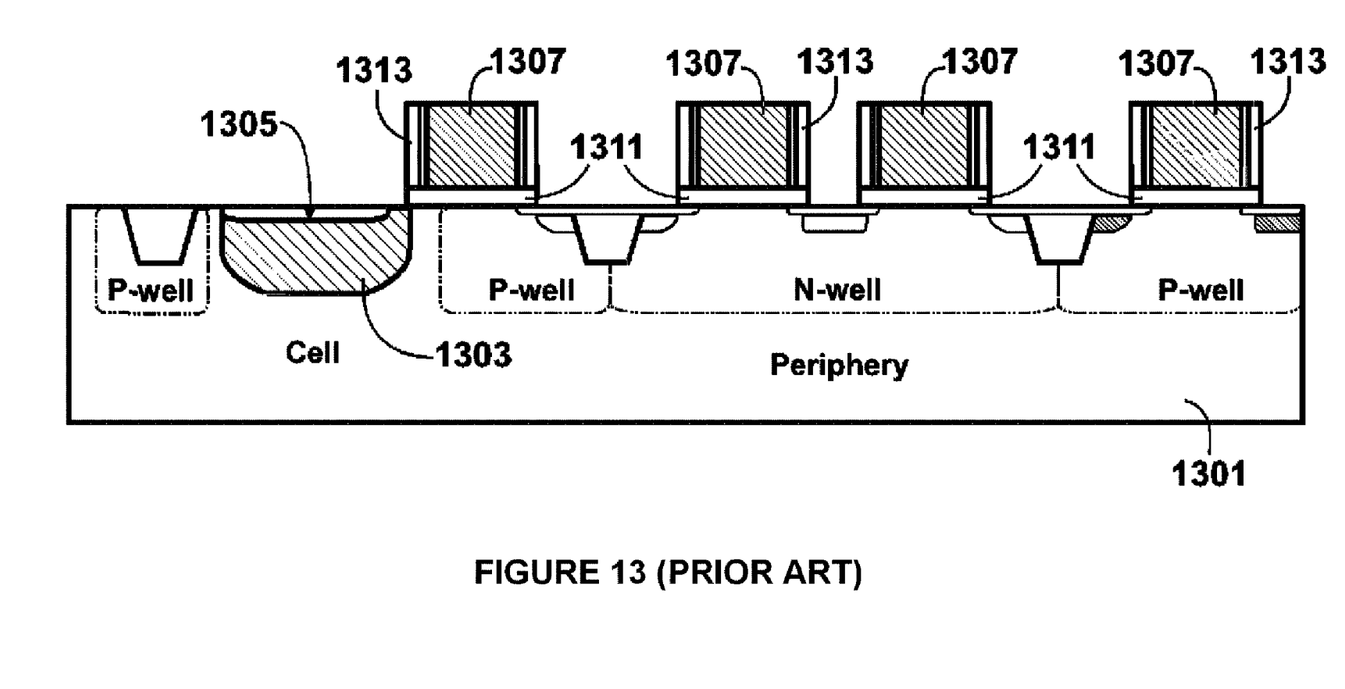
FIG. 13 is a simplified diagram illustrating a conventional method of fabricating a CMOS image sensor.

As shown, a thicker dielectric layer 1212 is formed overlying the photodiode device region at an early stage of the fabrication process according to embodiments of the present invention. This approach provides protection to the photodiode device region and eliminates defects that may arise from subsequent plasma etch process, for example, side wall spacer etch process. FIG. 13 is a simplified diagram illustrating a conventional method of fabricating a CMOS image sensor. As shown, a semiconductor substrate 1301 is provided. For example, the semiconductor substrate can be single crystal silicon doped using a P-type impurity. Also shown in FIG. 13 is a photodiode region 1303 doped with N type impurities. A P type impurity region 1305 is formed overlying the photodiode region or a pinned photodiode structure is shown. The P-type impurities on the surface is provided to prevent surface dark current leakage. The conventional method of fabricating the CMOS image sensor also includes forming a gate structure 1307 overlying a gate oxide layer 1311. The gate oxide layer can be a grown thermal oxide. The conventional method includes steps of implantation in source/drain regions and channel regions. Thereafter, a blanket dielectric layer is deposited overlying the gate structure. The blanket dielectric layer often includes silicon oxide. The blanket dielectric layer is subjected to an anisotropic etch process to form spacer structures 1313 overlying portions of the gate structure. In the conventional method, the spacer etch step also includes masking the photodiode region to prevent damage to the thermal oxide overlying the photodiode region during the spacer etch step. However, the photoresist material does not provide adequate protection to the gate oxide layer overlying the photodiode device area or the oxide/silicon interface. The defects in the gate oxide layer or the gate oxide/silicon interface causes leakage current as shown below.

Figure 14:
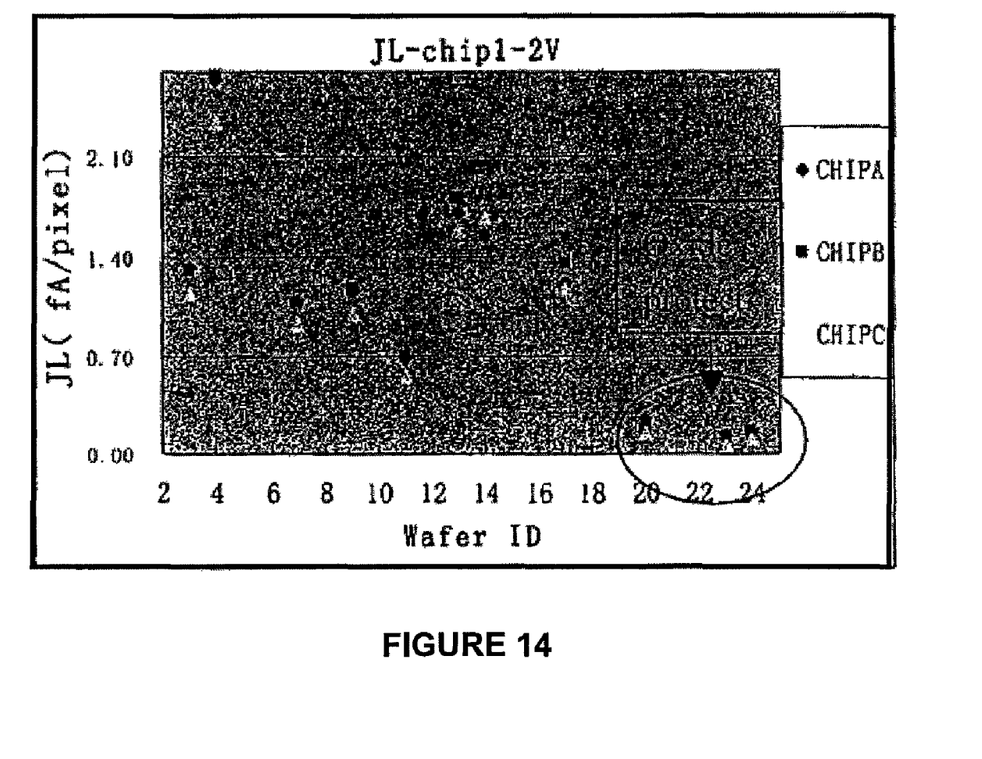
FIG. 14 is a simplified diagram illustrating a result according to an embodiment of the present invention.

FIG. 14 is an simplified diagram illustrating a result according to an embodiment of the present invention. A plot of junction leakage current versus wafer number is shown. Wafers numbered 2-18 were fabricated using convention method where the photodiode device region was not protected Wafers numbered 20-24 were fabricated using a thermal oxide having a thickness of about 100 Angstroms overlying the photodiode device region according to embodiment of the present invention. As shown, wafers 2-19 have a leakage current ranging from 0.7 to more than 2.1 fA per pixel while wafers 20-24 have almost no leakage current. Of course there can be other variations, modifications, and alternatives.

Although the above has been illustrated according to a specific embodiment, there can be other modifications, alternatives, and variations. For example, the substrate is provided using a P type impurity and the photodiode device region is provided using an N-type impurity region and the P type impurity. A substrate characterized by a N type impurity may also be used and the photodiode region can be provided using a P type impurity region and the N type impurity. Additionally, two gate structures are illustrated. The number of gate structure provided may vary depending on the embodiment. The method of forming gate dielectric layer of various thickness has been described using etch and growth process. Other methods, for example, using silicon oxide growth on regions of substrate having different dopant concentration or other triple gate processes. One skilled in the art would recognize many other modifications, variations, and alternatives. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a CMOS image sensor device, the method comprising:
   providing a semiconductor substrate having a P-type impurity characteristic including a surface region;
   forming a first silicon dioxide overlying the surface region;
   forming an N-type impurity region in a vicinity underlying a first region of the first silicon dioxide to cause formation of a photo diode device characterized by the N-type impurity region and the P-type impurity;

depositing a mask layer covering the first region of the first silicon dioxide;

removing a portion of the first silicon dioxide that is not covered by the mask layer;

removing the mask layer;

forming a first thickness of silicon dioxide in the first region and a second thickness of silicon dioxide in the portion that was not covered by the mask layer; and forming a first gate structure overlying a second region of the second thickness of silicon dioxide;

wherein the first thickness of the silicon dioxide prevents a surface damage on the first region of the surface region that is caused by a subsequent plasma etch process in order to reduce a dark current of the photo diode device.

2. The method of claim 1 further comprising forming a pin region between the first thickness of the silicon dioxide and the N-type impurity region.

3. The method of claim 1 wherein the first thickness is thicker than the second thickness.

4. The method of claim 1 wherein the first thickness is greater than about 100 Angstroms.

5. The method of claim 1 wherein the first gate structure is coupled to the photo diode device.

6. The method of claim 1 wherein the first thickness is a thermal oxide material.

7. The method of claim 1 wherein the first thickness is substantially silicon dioxide material.

8. The method of claim 1 wherein the first gate structure provides a threshold voltage of about 1.8V.

9. A method of forming a CMOS image sensor device, the method comprising:

providing a semiconductor substrate having a P-type impurity characteristic including a surface region;

forming a first silicon dioxide layer over the surface region of the semiconductor substrate;

forming an N-type impurity region in a vicinity underlying a first region of the first silicon dioxide layer to cause formation of a photo diode device characterized by the N-type impurity region and the P-type substrate;

depositing a first masking layer covering the first region including the photo diode device and exposing a first portion of the first silicon dioxide layer;

removing the first silicon dioxide layer that is exposed in the first portion;

removing the first masking layer;

subjecting the semiconductor substrate to a first oxidation process to obtain a second silicon dioxide layer having a first thickness in the first region and a second thickness in the first portion, the first thickness being greater than the second thickness;

depositing a second masking layer covering the first thickness in the first region including the photo diode device and a second region in the second thickness in the first portion and exposing a third region in the first portion of the first silicon dioxide layer;

removing the silicon dioxide in the exposed third region;

removing the second masking layer; and subjecting the semiconductor substrate to a second oxidation process to obtain a third silicon dioxide layer having a third thickness in the third region, wherein the second thickness is greater than the third thickness.

10. The method of claim 9 wherein the first thickness of the silicon dioxide reduces a surface damage on the first region of the surface region to reduce a dark current of the photo diode device.

11. The method of claim 9 further comprises forming a pin region between the first thickness of the silicon dioxide and the N-type impurity region.

12. The method of claim 9 wherein the first thickness is thicker than the second thickness or the third thickness.

13. The method of claim 9 wherein the forming an N-type impurity region comprises using an ion implant process using an arsenic species with an implant energy ranging from about 280 KeV to about 500 KeV at a dose of about 1E12 atoms per $cm^2$ to about 5E13 atoms per $cm^2$.

14. The method of claim 9 wherein the first thickness is greater than about 70 Angstroms to about 100 Angstroms.

15. The method of claim 9 wherein the first thickness is a thermal oxide material.

16. The method of claim 9 wherein the first thickness is substantially silicon dioxide material.

17. The method of claim 9 further comprising:

forming a first gate structure overlying the second region; and forming a second gate structure overlying the first region, wherein the second gate structure is coupled to the photo diode device.

18. The method of claim 17 wherein the second gate structure provides a threshold voltage of about 1.8V.

19. The method of claim 17 wherein the first gate structure provides a threshold voltage of about 3.3 Volts.

20. The method of claim 9 wherein the first silicon dioxide layer has a thickness ranging from about 10 angstroms to about 200 angstroms.

* * * * *